(12) United States Patent
Abe et al.

(10) Patent No.: US 9,142,013 B2
(45) Date of Patent: Sep. 22, 2015

(54) SUBSTRATE STORAGE CONDITION INSPECTING APPARATUS AND SUBSTRATE STORAGE FACILITY HAVING SAME

(71) Applicant: Daifuku Co., Ltd., Osaka-shi (JP)

(72) Inventors: Takeshi Abe, Gamo-gun (JP); Kouji Fujihara, Gamo-gun (JP)

(73) Assignee: Daifuku Co., Ltd., Osaka-shi (JP)

(*) Notice: Subject to any disclaimer, the term of this patent is extended or adjusted under 35 U.S.C. 154(b) by 332 days.

(21) Appl. No.: 13/888,681

(22) Filed: May 7, 2013

(65) Prior Publication Data
US 2013/0314531 A1 Nov. 28, 2013

(30) Foreign Application Priority Data
May 7, 2012 (JP) .................................. 2012-106018

(51) Int. Cl.
*H01L 31/0203* (2014.01)
*G06T 7/00* (2006.01)
*H01L 21/67* (2006.01)

(52) U.S. Cl.
CPC .............. *G06T 7/0004* (2013.01); *G06T 7/0006* (2013.01); *H01L 21/67271* (2013.01); *G06T 2207/30148* (2013.01)

(58) Field of Classification Search
CPC .............. H01L 21/67; H01L 21/67242; H01L 21/67271
See application file for complete search history.

(56) References Cited

U.S. PATENT DOCUMENTS

| | | | |
|---|---|---|---|
| 6,707,545 B1* | 3/2004 | Hunter | 356/237.5 |
| 6,959,255 B2* | 10/2005 | Ye et al. | 702/117 |
| 7,015,492 B2 | 3/2006 | Garssen et al. | |
| 7,037,735 B2* | 5/2006 | Noguchi et al. | 438/18 |
| 2012/0281875 A1 | 11/2012 | Yasuda et al. | |

FOREIGN PATENT DOCUMENTS

| | | |
|---|---|---|
| JP | 11111810 A | 4/1999 |
| JP | 11243130 A | 9/1999 |
| JP | 200564515 A | 3/2005 |
| JP | 2009135276 A | 6/2009 |
| JP | 2011249642 A | 12/2011 |
| WO | 2011062138 A1 | 5/2011 |

* cited by examiner

Primary Examiner — Chandra Chaudhari
(74) Attorney, Agent, or Firm — The Webb Law Firm (57) ABSTRACT

A substrate storage condition inspecting apparatus includes an illumination device, an imaging device, and a substrate storage condition determining unit. The illumination device includes, on the front side of an opening of a transport container located at an inspecting position, a first illumination portion and a second illumination portion that are spaced apart in the width direction of the opening. The substrate storage condition determining unit detects a pair of high-luminance portions on an inspection image captured by the imaging device, the pair of high-luminance portions being generated in locations circumferentially spaced apart in the peripheral edge portion of the semiconductor substrate by light applied by the first illumination portion and the second illumination portion, and determines whether or not the storage orientation of the semiconductor substrate is abnormal on the basis of the positional correspondence in the vertical direction for the pair of high-luminance portions.

6 Claims, 6 Drawing Sheets

Fig.7

SUBSTRATE STORAGE CONDITION INSPECTING APPARATUS AND SUBSTRATE STORAGE FACILITY HAVING SAME

FIELD OF THE INVENTION

The present invention relates to a substrate storage condition inspecting apparatus whose inspection object is a transport container that is provided with, in a storage space for storing a disk-shaped semiconductor substrate, support bodies for supporting an outer circumferential portion of the semiconductor substrate that are arranged in a plurality of stages in a state in which the support bodies are spaced apart in a vertical direction, and is provided with an opening through which the semiconductor substrate is transported in and out of the storage space from and to the outside, and a substrate storage facility having the same.

BACKGROUND

JP 2005-64515A (Patent Document 1) discloses an example of a substrate storage condition inspecting apparatus as described above. According to the configuration of Patent Document 1, an imaging device captures an image of a semiconductor substrate stored in a transport container, the angle of inclination of the semiconductor substrate relative to the horizontal direction is calculated on the basis of the captured image, and it is determined whether or not an abnormal storage condition has occurred in which, for example, the semiconductor substrate is stored in a laterally inclined orientation.

The substrate storage condition inspecting apparatus of Patent Document 1 needs to perform, for all of a plurality of semiconductor substrates, a complex analysis that involves extracting, from the captured image of each semiconductor substrate, edges of a plurality of locations of the semiconductor substrate that are circumferentially aligned in the peripheral edge portion, determining a straight line connecting the plurality of edges for each semiconductor substrate, and determining the inclination of the semiconductor substrate from the angle of inclination of the straight line relative to the horizontal direction. This has complicated the configuration for determining whether or not a semiconductor substrate is in an abnormal storage condition inside the transport container.

SUMMARY OF THE INVENTION

In view of the foregoing circumstances, there is a need for achieving a substrate storage condition inspecting apparatus capable of determining, with a simple configuration, whether or not a semiconductor substrate is in an abnormal storage condition inside a transport container, and a substrate storage facility having the substrate storage condition inspecting apparatus.

A substrate storage condition inspecting apparatus according to the present invention whose inspection object is a transport container that is provided with, in a storage space for storing a disk-shaped semiconductor substrate, support bodies for supporting an outer circumferential portion of the semiconductor substrate that are arranged in a plurality of stages in a state in which the support bodies are spaced apart in a vertical direction, and is provided with an opening through which the semiconductor substrate is transported in and out of the storage space from and to the outside, includes:

an illumination device that applies light through the opening to the semiconductor substrate stored in the transport container located at an inspecting position;

an imaging device that captures an image of the semiconductor substrate to which light has been applied by the illumination device; and a substrate storage condition determining unit that performs substrate storage condition determination processing for determining whether or not a storage orientation of the semiconductor substrate is normal on the basis of the image captured by the imaging device, wherein the illumination device includes, on a front side of the opening of the transport container located at the inspecting position, a first illumination portion and a second illumination portion that are spaced apart in a width direction, which is orthogonal to the vertical direction of the opening, and the substrate storage condition determining unit is configured to:

perform luminescent spot detection processing for detecting a pair of high-luminance portions on an inspection image captured by the imaging device, the pair of high-luminance portions being generated by light applied by the first illumination portion and the second illumination portion in locations of a peripheral edge portion of the semiconductor substrate that are circumferentially spaced apart; and perform orientation determination processing for determining whether or not the storage orientation of the semiconductor substrate is abnormal on the basis of a positional correspondence in the vertical direction for the pair of high-luminance portions detected on the inspection image by the luminescent spot detection processing.

That is, light is applied to the semiconductor substrate stored in the transport container by the first illumination portion and the second illumination portion that are spaced apart in the width direction of the opening (opening width direction) on the front side of the opening of the transport container located at the inspecting position. Accordingly, when a semiconductor substrate is stored in the storage space, a pair of high-luminance portions are generated on an inspection image captured by the imaging device in locations that are circumferentially spaced apart in the peripheral edge portion of the semiconductor substrate.

Also, in a proper storage condition in which the semiconductor substrate is supported by one or more support bodies constituting the same stage (e.g., a pair of support bodies located at the same height in the vertical direction), a pair of high-luminance portions are generated on the inspection image in a position in the vertical direction that corresponds to the position of the support bodies. On the other hand, when the semiconductor substrate is not properly supported by the support bodies, for example, because the semiconductor substrate is in an inclined orientation, one of the pair of high-luminance portions will not be generated at a position in the vertical direction that corresponds to the position of the support bodies.

Thus, when the semiconductor substrate is properly supported by the support bodies, the positions, in the vertical direction, of the pair of high-luminance portions detected on the inspection image are the same. When the semiconductor substrate is not properly supported by the support bodies, the positions, in the vertical direction, of the pair of high-luminance portions are different.

Accordingly, it is possible to determine whether or not the storage orientation is proper by checking whether or not another high-luminance portion is generated at a position that is located at the same height as the position of a high-luminance portion detected on the inspection image and that is different from the position of the high-luminance portion in the opening width direction. In this way, it is possible to determine whether or not the semiconductor substrate is stored in a proper storage orientation in the storage space by using a simple method that involves comparing the positions, in the vertical direction, of a pair of high-luminance portions spaced apart in the opening width direction, which are detected on the inspection image.

Thus, with the above-described configuration, it is possible to achieve a substrate storage condition inspecting apparatus capable of determining whether or not the semiconductor substrate is in the abnormal storage condition in the transport container by using a simple configuration.

In the following, examples of preferred embodiments of the present invention will be described.

In an embodiment of the substrate storage condition inspecting apparatus of the present invention, it is preferable that each of the first illumination portion and the second illumination portion includes a light source configured in a vertically elongated form.

In other words, it is possible to apply light to all semiconductor substrates supported on the support bodies provided in a plurality of stages in the vertical direction of the storage space through the opening in conditions that are as uniform as possible. Thus, on the inspection image captured by the imaging device, it is possible to appropriately generate high-luminance portions in a semiconductor substrate supported by the support bodies at any position in the vertical direction.

Thus, it is possible to appropriately detect any high-luminance portion that is generated in the semiconductor substrate, regardless of the position in the storage space in the vertical direction.

In an embodiment of the substrate storage condition inspecting apparatus according to the present invention, it is preferable that the imaging device is constituted by a single imaging camera.

In other words, to capture images the pair of high-luminance portions spaced apart in the opening width direction, the imaging device is constituted by a single imaging camera. Accordingly, it is possible to achieve a more simplified configuration compared with, for example, a configuration in which an imaging device is separately provided for each of a pair of high-luminance portions.

In this case, it is possible to obtain an inspection image by a single image-capturing process by setting the field of view of the single imaging camera to a region in which it is possible to capture images of all the pairs of high-luminance portions of the plurality of semiconductor substrates stored in the storage space in the vertical direction.

In an embodiment of the substrate storage condition inspecting apparatus according to the present invention, it is preferable that a display device that displays a result of determination performed by the substrate storage condition determining unit is provided, the substrate storage condition determining unit is configured to, if it is determined that another high-luminance portion does not exist in a corresponding portion that is located at a height corresponding to a high-luminance portion detected on the inspection image by the luminescent spot detection processing and that is set at a different position in the width direction from the position of said high-luminance portion, determine the corresponding portion to be an abnormal portion in which the semiconductor substrate does not exist, and perform abnormality display processing, and the abnormality display processing is processing for displaying, on the display device, a high-luminance symbol indicating the high-luminance portion and an abnormality symbol indicating the abnormal portion in association with a relative positional relationship between the high-luminance portion and the abnormal portion on the inspection image.

That is, if a high-luminance portion on the other side in the opening width direction does not exist at a height corresponding to the height of the high-luminance portion detected on one side in the opening width direction, an abnormality symbol indicating a portion in which no high-luminance portion exists is displayed on the display device. Accordingly, the symbol displayed on the display device allows the user to easily recognize the occurrence of an abnormality in the storage orientation of the semiconductor substrate as well as at which position in the storage space the storage orientation abnormality has occurred.

Thus, the user who has recognized the occurrence of an abnormality in the storage orientation of the semiconductor substrate can take measures to correct the storage orientation of the semiconductor substrate in order to correct the transport orientation of the semiconductor substrate in that transport container.

Thus, with the above-described configuration, it is possible to provide a substrate storage condition inspecting apparatus that is easy for the user to use.

In an embodiment of the substrate storage condition inspecting apparatus according to the present invention, it is preferable that the inspecting position is set on a transport path along which the transport container is transported, the first illumination portion and the second illumination portion are provided at positions that are located on both sides, in the width direction, of a movement range of the transport container on the transport path and that do not overlap the movement range, and the imaging device is provided at a position that is located above the transport path and that does not overlap the movement range.

That is, the semiconductor substrate stored in the transport container is image-captured at the inspecting position provided on the transport path along which the transport container is transported. Accordingly, in the case where the transport container is transported for processing, the semiconductor substrate in the storage space can be image-captured during transportation of the transport container in order to obtain an inspection image. Then, the illumination device and the imaging device are provided at positions that do not overlap the movement range of the transport container moving along the transport path, and therefore, the illumination device and the imaging device do not interfere with the moving transport container.

Accordingly, for example, compared with a configuration in which each time image-capturing is performed, the illumination device or the imaging device is moved to the front of the transport container overlapping the movement range of the transport container, and is then retracted to a location where it does not overlap the movement range of the transport container after completion of image-capturing, it is possible to achieve a more simplified configuration because it is not necessary to provide any configuration for moving the illumination device or the imaging device. Moreover, the illumination device or the imaging device does not have to be moved, and it is thus possible to promptly capture an image of the semiconductor substrate after the transport container is situated at the inspecting position.

A substrate storage facility according to the present invention is a substrate storage facility having a substrate storage condition inspecting apparatus with the above-described configurations, and includes:

a container storage shelf including a plurality of storage portions for storing the transport container, wherein the substrate storage condition inspecting apparatus is provided at an inlet port of the container storage shelf, or on a transport device that transports the transport container toward the inlet port.

That is, the substrate storage condition inspecting apparatus is provided at the inlet port of the container storage shelf, or on the transport device that transports the transport container toward the inlet port. Therefore, if an abnormality has occurred in the storage orientation of the semiconductor substrate stored in the transport container, the user can recognize the occurrence of an abnormality in the storage orientation of the semiconductor substrate at the time of transport for storage in the container storage shelf.

Thus, the user can effectively utilize the time for storing the transport container to take measures for correcting any abnormality of the orientation in which the semiconductor substrate is stored.

DETAILED DESCRIPTION

An embodiment of a substrate storage facility having a substrate storage condition inspecting apparatus of the present invention will now be described with reference to the accompanying drawings.

Figure 1:
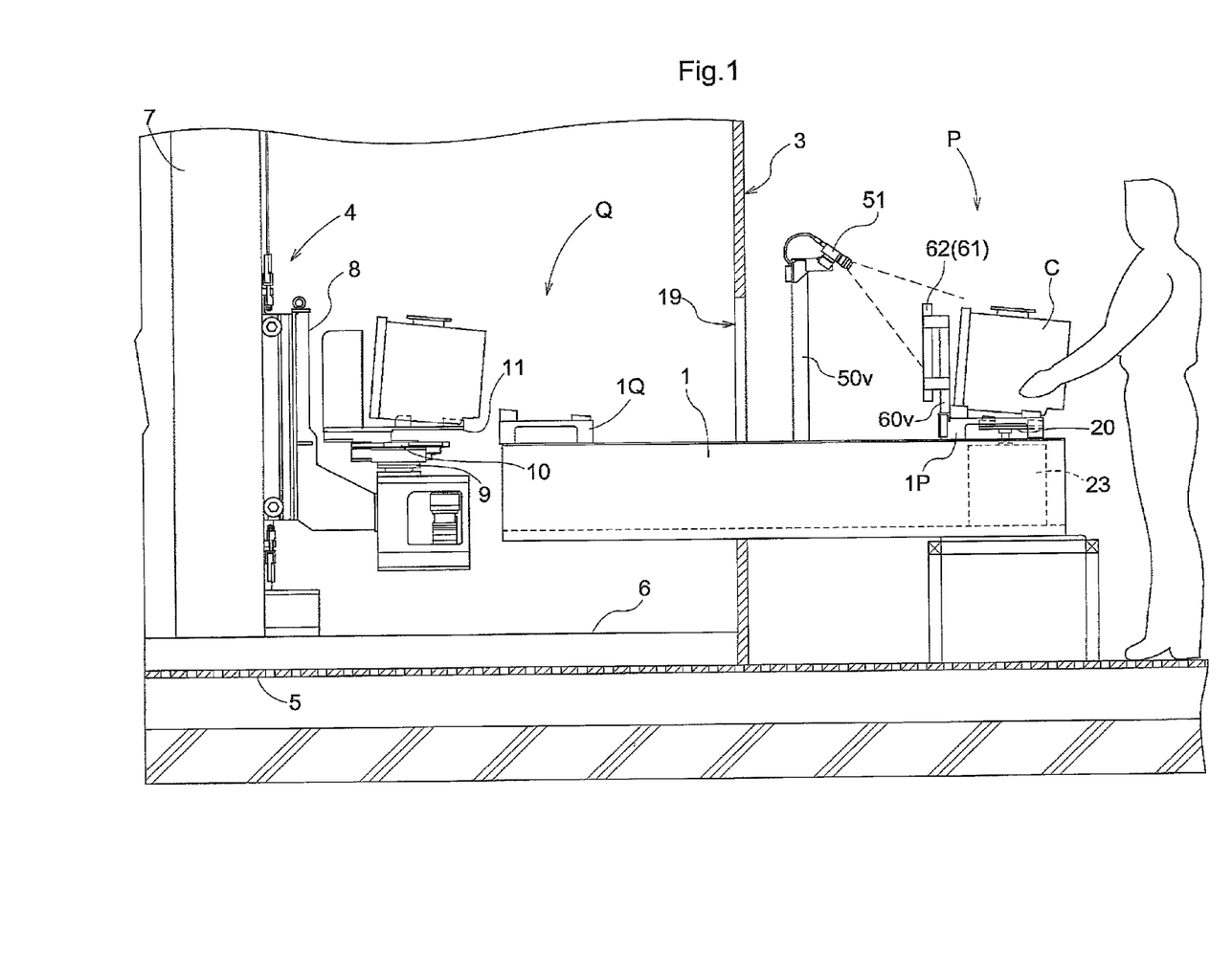
FIG. 1 is a diagram showing a relevant part of a substrate storage facility having a substrate storage condition inspecting apparatus.

As shown in FIG. 1, the substrate storage facility includes a stocker 3 and a conveyor 1 serving as a transport device that transports, toward an inlet port 19 of the stocker 3, a transport container C for storing semiconductor substrates. The stocker 3 is internally provided with a container storage shelf including a plurality of storage portions (not shown) for storing a transport container C. The conveyor 1 is used to load and unload the transport container C to and from the stocker 3.

A point on an end side of the conveyor 1 that is opposite the stocker 3 is an operator's transfer point P where the drop-off transfer for dropping off, outside the stocker 3, the transport container C unloaded from the stocker 3, and the pick-up transfer for picking up, outside the stocker 3, the transport container C that is to be loaded to the stocker 3 are performed, for example. Meanwhile, a point on an end side of the conveyor 1 that is located inside the stocker 3 (the point on the end side on the stocker 3 side) is an intra-stocker transfer point Q where the pick-up transfer for picking up, inside the stocker 3, the transport container C that is to be unloaded from the stocker 3, and the drop-off transfer for dropping off, inside the stocker 3, the transport container C loaded to the stocker 3 are performed, for example. Then, the operator performs, while standing, a transfer operation for, for example, receiving the transport container C located at the operator's transfer point P of the conveyor 1 or supplying the transport container C to the operator's transfer point P of the conveyor 1 in the vicinity of the operator's transfer point P.

The stocker 3 and the conveyor 1 are installed inside a clean room equipped with an air cleaning device. On the floor side of the clean room, a porous grating floor 6 is provided above and spaced apart from a slab floor 5. On the ceiling side of the clean room, an air filter (not shown), which is, for example, a HEPA filter, is provided below and spaced apart from the ceiling. The air cleaning device includes an intake room formed below the grating floor 6, a chamber room formed above the air filter, and a circulation path communicating between the intake room and the chamber room. The circulation path includes a ventilation fan and a prefilter. Then, operating the ventilation fan of the air cleaning device causes a downflow of cleaned air to be formed, from the ceiling side to the floor side.

An elevating intra-stocker transfer device 4 is installed inside the stocker 3. The intra-stocker transfer device 4 includes an elevator body 8 capable of ascending and descending along an intra-stocker elevating guide 7 provided upright on the grating floor 6, and an intra-stocker transfer mounting table 11 attached to the elevator body 8 via a swivel table 9 and a link mechanism 10.

A plurality of storage tables (not shown) for mounting and supporting a transport container C are provided inside the stocker 3, and a storage portion for storing the transport container C is formed in the space above each of the storage tables. The storage portions are arranged in multiple stages in the vertical direction and in a radial manner so as to surround the intra-stocker transfer device 4 in plan view.

Then, the ascending/descending operation of the elevator body 8, the turning operation of the swivel table 9, and the extending/contracting operation of the link mechanism 10 are combined so as to move the position of the intra-stocker transfer mounting table 11 and to change the orientation of the intra-stocker transfer mounting table 11 in plan view, thus performing an unloading carry-in operation and a loading carry-out operation. Here, the unloading carry-in operation refers to an operation for picking up a transport container C that is stored in the storage portion in a state in which it is mounted and supported on the storage table, and causing that transport container C to be mounted and supported on an intra-stocker mounting table 1Q provided at the intra-stocker transfer point Q of the conveyor 1.

Meanwhile, the loading carry-out operation refers to an operation for picking up a transport container C that is mounted and supported on the intra-stocker mounting table 1Q, and causing that transport container C to be mounted and supported on the storage table in an empty storage portion.

Figure 6:
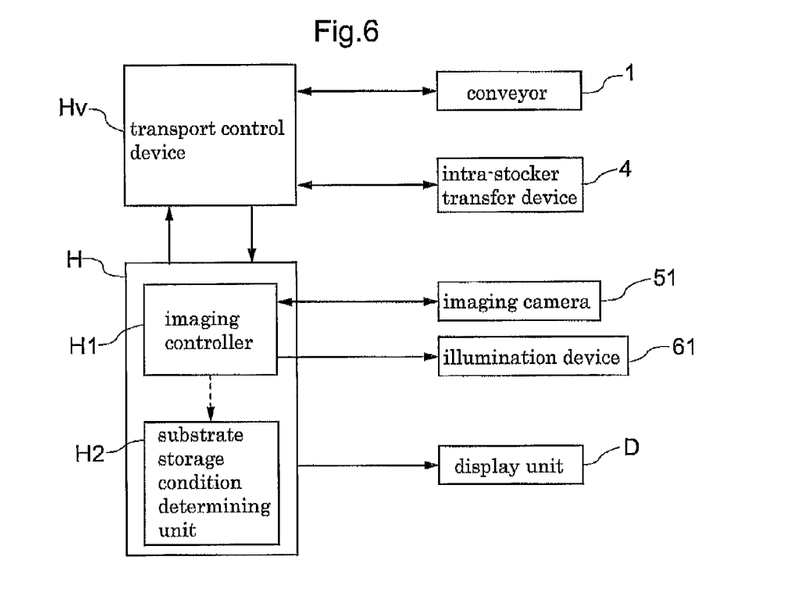
FIG. 6 is a control block diagram.

Additionally, as shown in FIG. 6, a transport control device Hv that controls the operation of the conveyor 1 and the intra-stocker transfer device 4 is provided.

The conveyor 1 is installed at a predetermined installation height, which is adjusted to the waist height of the operator, above the grating floor 6. The conveyor 1 is configured such that a transport container C to be transported is mounted on and transported between the operator's transfer point P and the intra-stocker transfer point Q by a mounting table 20 that reciprocates along a transport plane in the horizontal direction.

The mounting table 20 is provided at an upper end of a travelling body 23 traveling inside a conveyor frame 22, which is a component of the conveyor 1, along the longitudinal direction of the conveyor frame 22. Although not shown, the travelling body 23 includes travel wheels at its lower end, and is configured to freely travel/move between the operator's transfer point P and the intra-stocker transfer point Q.

Then, at the operator's transfer point P or the intra-stocker transfer point Q, the mounting table 20 is moved up to a transport ascending position at which its top face coincides with the transport plane and moved down to a transfer descending position located below the transport ascending position, and thereby, the transport container C is transferred between the mounting table 20 and an inspection mounting table 1P at the operator's transfer point P, or the transport container C is transferred between the mounting table 20 and the intra-stocker mounting table 1Q at the intra-stocker transfer point Q. Note that the above-described transport plane is an imaginary plane located above the top face of the conveyor frame 22.

Figure 2:
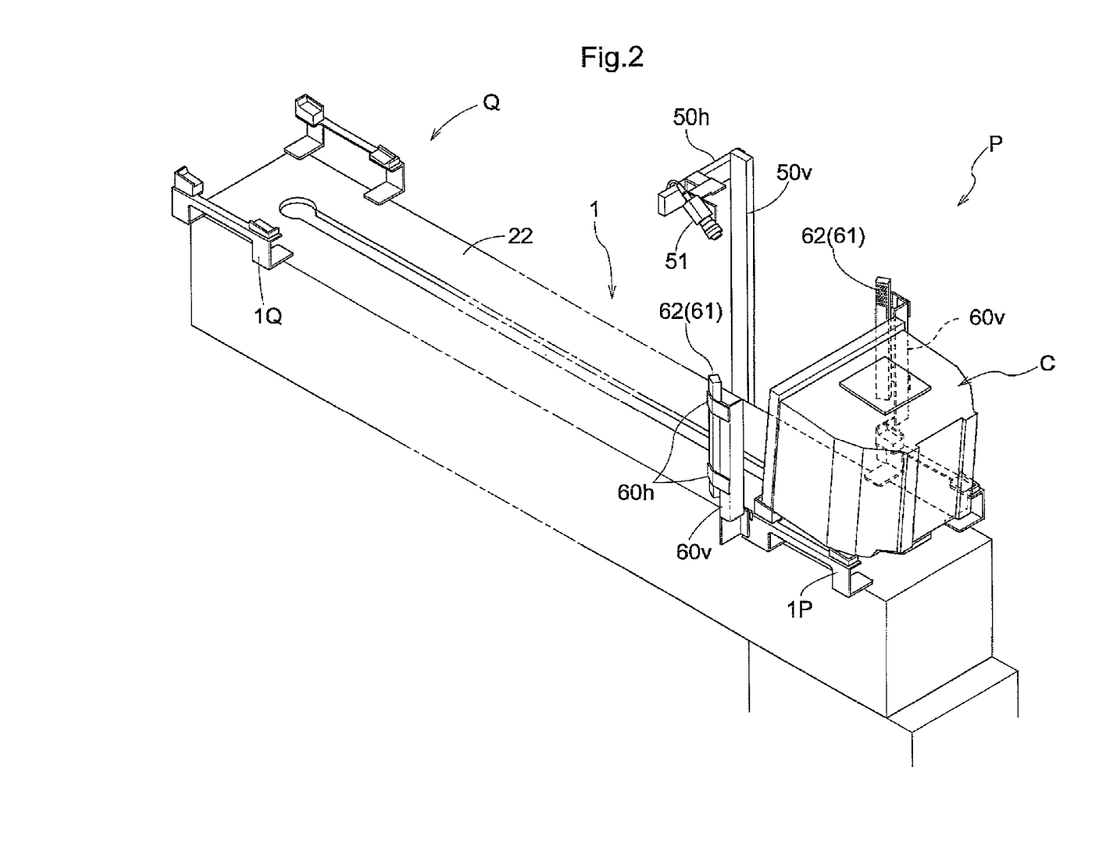
FIG. 2 is a diagram illustrating a configuration in which the substrate storage condition inspecting apparatus is provided on a transport device.

As shown in FIGS. 1 and 2, the inspection mounting table 1P is fixedly attached to the top plate of the conveyor frame 22 at the operator's transfer point P of the conveyor 1. The inspection mounting table 1P is provided so as to support the transport container C in a state in which an opening Co at the front of the transport container C faces the stocker 3 and the opening direction of the opening Co (i.e., the direction in which substrates are transported in and out of the transport container C) is upwardly inclined at a preset angle (5 degrees in this example) with respect to the horizontal plane. Further, the intra-stocker mounting table 1Q is fixedly attached to the top plate of the conveyor frame 22 at the intra-stocker transfer point Q of the conveyor 1. As with the inspection mounting table 1P, the intra-stocker mounting table 1Q is also fixedly attached to the top plate of the conveyor frame 22 so as to support the transport container C in a state in which the opening direction of the opening Co of the transport container C is upwardly inclined at 5 degrees with respect to the horizontal plane.

Configuration of Transport Container

Figure 3:
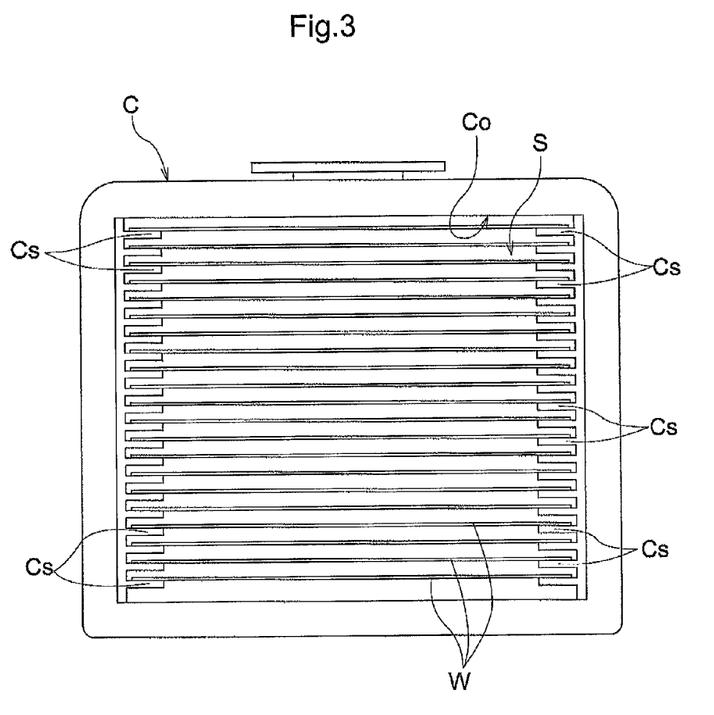
FIG. 3 is a front view of the transport container.

As shown in FIG. 3, the transport container C includes a storage space S for storing disk-shaped wafers W (semiconductor substrates). In the storage space S, support bodies Cs supporting the outer circumferential portion of the wafers W are arranged in a plurality of stages in a state in which they are spaced apart in the vertical direction. In this example, a pair of support bodies Cs is provided at each stage. Provided on the front side of the transport container C is the opening Co through which the wafers W are transported in and out of the storage space S from and to the outside. Note that the vertical direction for the transport container C is the direction in which the wafers W are stacked in the storage space S (the vertical direction in FIG. 3).

Here, the transport container C is an airtight container made of synthetic resin that is in compliance with the SEMI (Semiconductor Equipment and Materials International) standard, and examples thereof include those called FOSB and FOUP. Ordinarily, these FOSB and FOUP are provided with a front cover for closing the opening Co. However, the present embodiment assumes the use in the clean room as described above, and thus the transport container C is used without closing the opening Co by a front cover.

Before the transport container C is stored in the stocker 3, or in other words, at the operator's transfer point P of the conveyor 1 that transports the transport container C toward the inlet port 19 of the stocker 3, the transport container C is inspected as to whether or not the storage orientation of the wafers W in the storage space S of the transport container C is normal. That is, in the present embodiment, the operator's transfer point P corresponds to the "inspecting position" of the present invention. Therefore, the inspecting position is set on a transport path along which the transport container C is transported.

Substrate Storage Condition Inspecting Apparatus

A description will now be given of a substrate storage condition inspecting apparatus that performs inspection as to whether the storage orientation of the wafers W is normal.

As shown in FIGS. 1, 2, 4, and 5, the substrate storage condition inspecting apparatus includes an illumination device 61 that applies light to the wafers W stored in the transport container C located at the operator's transfer point P through the opening Co of the transport container C, and an imaging camera 51 serving as an imaging device for capturing images of the wafers W in the storage space S to which light has been applied by the illumination device 61.

The illumination device 61 includes a pair of illumination portions 62 that are spaced apart in the width direction of the opening Co of the transport container C, each of the illumination portions 62 being configured by a plurality of infrared LEDs that are aligned in a vertically elongated form. Here, the width direction of the opening Co (opening width direction) is a direction (the lateral direction in FIG. 3, the vertical direction in FIG. 4) orthogonal to both the vertical direction and the opening direction of the opening Co. One of the pair of illumination portions 62 corresponds to the "first illumination portion" of the present invention, and the other corresponds to the "second illumination portion" of the present invention.

In the present embodiment, the pair of illumination portions 62 are fixedly supported relative to the conveyor frame 22 by vertical support bodies 60v that are vertically upright respectively from both sides in the width direction, which is orthogonal to the longitudinal direction of the conveyor 1 at the inspection mounting table 1P, and horizontal support bodies 60h horizontally extending from two locations of the vertical support body 60v that are spaced apart in the vertical direction.

In other words, the illumination device 61 includes a light source configured in a vertically elongated form. Additionally, the illumination device 61 includes the pair of illumination portions 62 that are spaced apart in the opening width direction (lateral direction) on the front side of the opening Co of the transport container C located at the operator's transfer point P.

Figure 4:
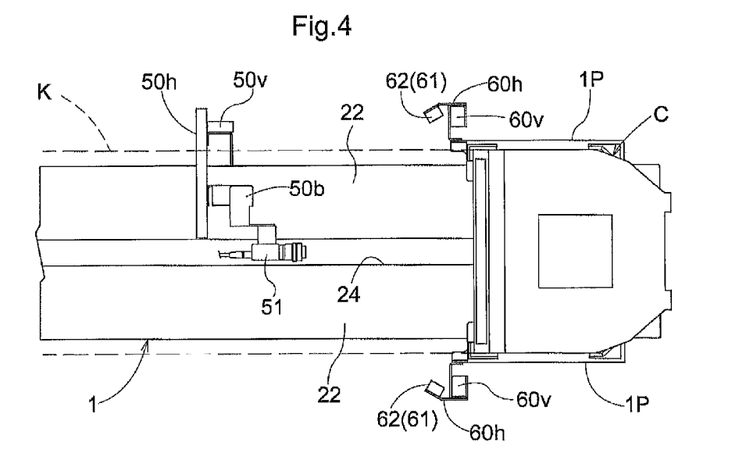
FIG. 4 is a diagram showing a positional relationship between the transport container located at an inspecting position and each of an illumination device and an imaging camera.

Further, as shown in FIG. 4, the pair of illumination portions 62 are provided at positions that are located on both sides, in the opening width direction, of a movement range K of the transport container C on the transport path and that do not overlap the movement range K.

The imaging camera 51 is fixedly supported relative to the conveyor frame 22 with a vertical support body 50v that is vertically upright from one side of the conveyor 1 in the width direction, which is orthogonal to the longitudinal direction, a horizontal support body 50h horizontally extending from an upper end portion of the vertical support body 50v, and a support bracket 50b attached to the horizontal support body 50h. Note that the support bracket 50b supports the imaging camera 51 at a position that overlaps the conveyor 1 in plan view and that is located at the center of the conveyor 1 in the width direction, which is orthogonal to the longitudinal direction. The imaging camera 51 is capable of capturing images using the infrared light applied by the above-described infrared LEDs, and its field of view is set to a range in which all the wafers W stored in the storage space S of the transport container C can be image-captured.

Figure 5:
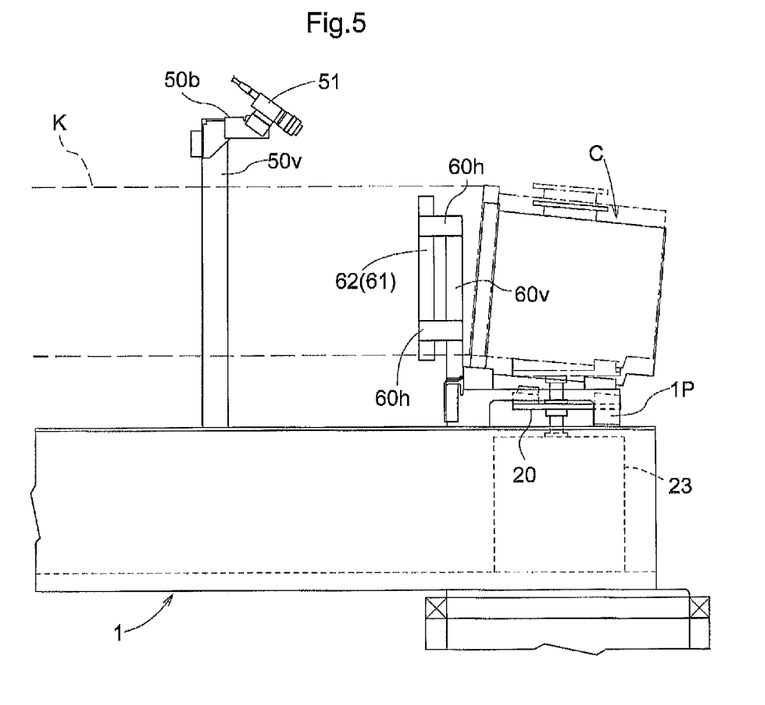
FIG. 5 is a diagram showing a positional relationship between the transport container located at the inspecting position and each of the illumination device and the imaging camera.

That is, as shown in FIG. 4, the pair of illumination portions 62 are provided at positions that are on both sides, in the opening width direction, of the movement range of the transport container C on the transport path and that do not overlap the movement range K. As shown in FIG. 5, the imaging camera 51 is provided at a position that is above the transport path and that does not overlap the movement range K.

As shown in FIG. 6, the substrate storage condition inspecting apparatus includes a determination control device H including an imaging controller H1 and a substrate storage condition determining unit H2. The determination control device H is configured by a computer including a memory and a processor, for example. The program process constituting the imaging controller H1 and the program process constituting the substrate storage condition determining unit H2 are executed by the processor of the computer.

Further, the imaging camera 51 and the illumination device 61 are connected to the determination control device H via a control interface or a data transfer interface. The imaging controller H1 is configured to be capable of providing an image-capturing command to and receiving imaging data from the imaging camera 51, and is also configured to be capable of providing an operating command to the illumination device 61 (an energizing command to the LEDs) in synchronization with the image-capturing command.

Then, as image-capturing processing, the imaging controller H1 provides the operating command to the illumination device 61, while providing the image-capturing command to the imaging camera 51, and transfers the image captured by the imaging camera 51 to the substrate storage condition determining unit H2 as an inspection image.

Although not shown, the inspection mounting table 1P is provided with a mounting detection sensor for detecting that the transport container C is mounted thereon. When the mounting detection sensor detects that the transport container C is mounted on the inspection mounting table 1P, the determination control device H performs the above-described image-capturing processing.

The substrate storage condition determining unit H2 determines whether or not the storage orientation of the wafers W in the storage space S is normal on the basis of the image captured by the imaging camera 51.

The determination control device H includes, as an output interface, a display unit D capable of outputting images, and the display unit D is configured to be capable of displaying the result of processing performed by the determination control device H. Additionally, the determination control device H includes, as input interfaces, a pointing device (e.g., a mouse) and a character input device (e.g., a keyboard).

Figure 7:
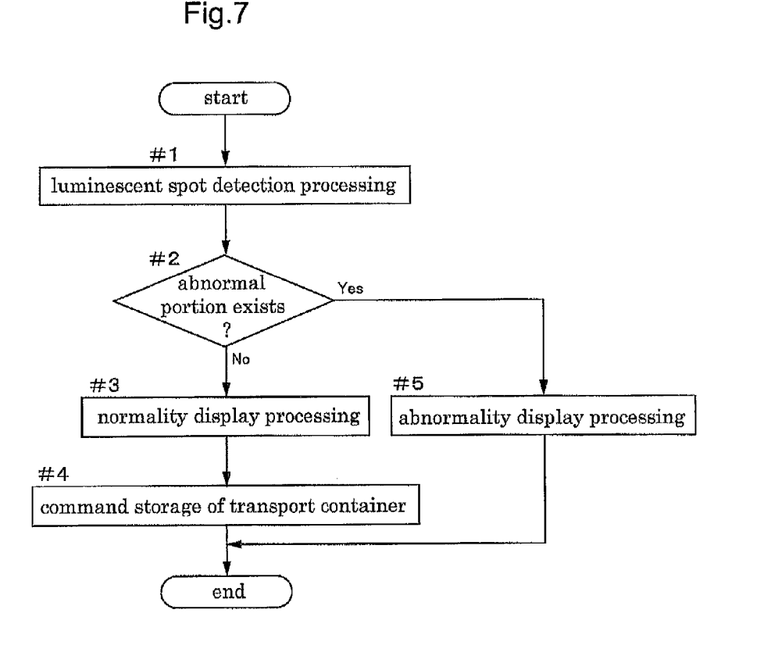
FIG. 7 is a flowchart illustrating orientation determination processing.

The processing performed by the substrate storage condition determining unit H2 will now be described with reference to the flowchart in FIG. 7.

The substrate storage condition determining unit H2 performs luminescent spot detection processing for detecting one or a plurality of pairs of high-luminance portions generated in locations in the peripheral edge portion of the wafer(s) W that are circumferentially spaced apart by light applied by the illumination device 61 (the pair of illumination portions 62 in this example) on an inspection image that has been captured by the imaging camera 51 in the above-described image-capturing processing (Step #1). Note that a pair of high-luminance portions are detected when a single wafer W is stored in the storage space S, and a plurality of pairs of high-luminance portions are detected when a plurality of wafers W are stored in the storage space S.

The luminescent spot detection processing is processing for detecting, on an inspection image, luminescent spots that are spaced apart in the opening width direction of the wafer W, the luminescent spots being generated by application of light from the pair of illumination portions 62.

Subsequently, the substrate storage condition determining unit H2 performs orientation determination processing for determining whether or not the storage orientation of the semiconductor substrate is abnormal by determining, for the high-luminance portions that are spaced apart in the opening width direction, which has been detected on the inspection image by the luminescent spot detection processing, whether or not a normal condition has occurred in which a high-luminance portion exists on the other side at a height corresponding to the height of the high-luminance portion detected on one side in the opening width direction, or an abnormal condition has occurred in which the high-luminance portion on the other side does not exist (Step #2). In other words, in the orientation determination processing, it is determined that the abnormal condition has occurred if it is determined that another high-luminance portion does not exist in a corresponding portion that is located at a height corresponding to the height of the high-luminance portion detected by the luminescent spot detection processing on the inspection image and that is set at a different position in the opening width direction from that high-luminance portion.

Figure 8:
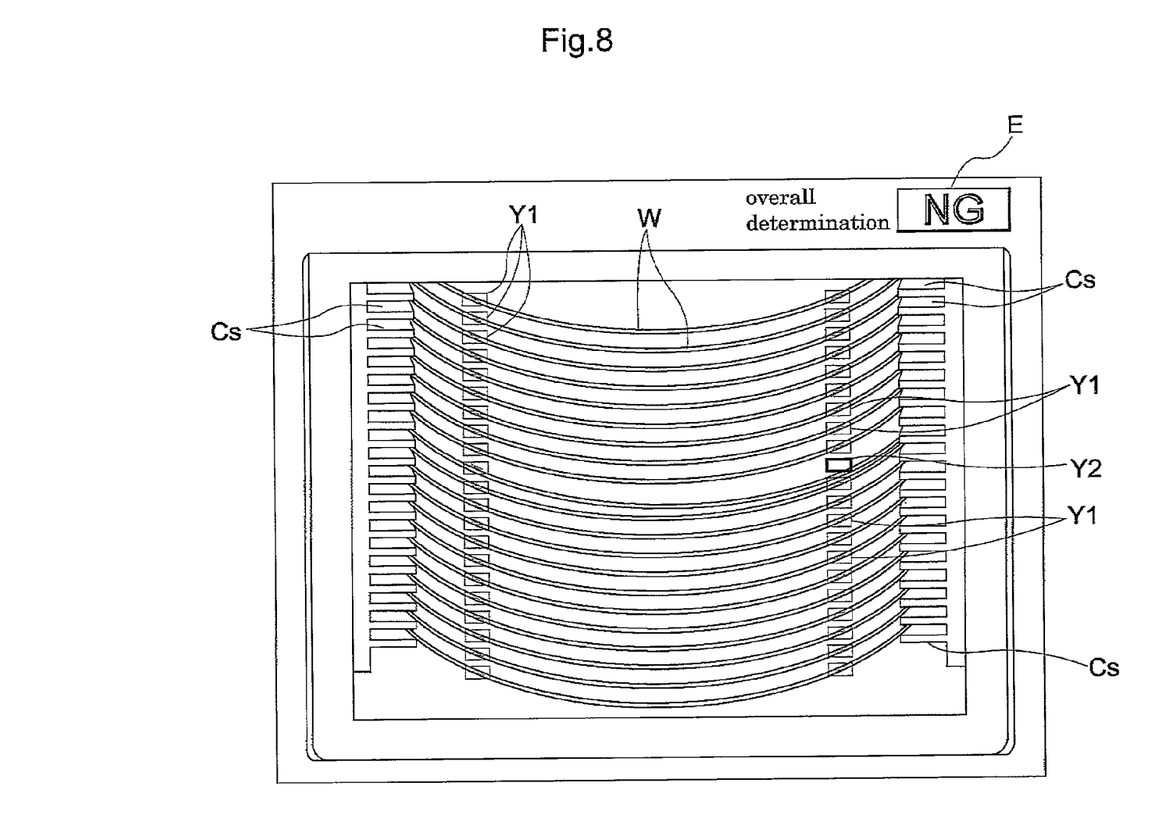
FIG. 8 is a diagram showing the content displayed during abnormality display processing.

If it is determined in Step #2 that the abnormal condition has occurred (Step #2: Yes), the substrate storage condition determining unit H2 determines the portion in which no high-luminance portion exists (i.e., the above-described corresponding portion) as being an abnormal portion in which no wafer W exists, and performs abnormality display processing (Step #5). As shown in FIG. 8, the abnormality display processing is processing for displaying a high-luminance symbol Y1 indicating a high-luminance portion and an abnormality symbol Y2 indicating an abnormal portion on the display unit D in association with the relative positional relationship between the high-luminance portion and the abnormal portion on the inspection image. In the abnormality display processing in the example shown in FIG. 8, "NG" is displayed as an overall determination result display E as shown in the upper right in the display area in FIG. 8.

Note that at the time of performing the abnormality display processing, the substrate storage condition determining unit H2 provides a transport stop command to the transport control device Hv.

If it is determined in Step #2 that the normal condition has occurred (Step #2: No), the substrate storage condition determining unit H2 performs normality display processing for displaying the inspection image on the display unit D, and displaying only the position at which the high-luminance symbol Y1 indicating the high-luminance portion exists, in a state in which that position is superimposed on the inspection image (Step #3). Although the illustration of the normality display processing is omitted, "OK", which indicates the normal condition, is displayed as the overall determination result display E.

Subsequently to the normality display processing (Step #3), the substrate storage condition determining unit H2 provides a transport command to the transport control device Hv. Thereby, the conveyor 1 and the intra-stocker transfer device 4 are operated, and the transport container C is stored in the stocker 3.

In the present embodiment, the display unit D corresponds to the "display device" that displays the result of determination performed by the substrate storage condition determining unit H2.

Then, the substrate storage condition determining unit H2 is configured to perform the orientation determination processing for determining whether or not the storage orientation of the semiconductor substrate is abnormal on the basis of the positional correspondence in the vertical direction for the high-luminance portions that are spaced apart in the opening width direction, which are detected on the inspection image by the luminescent spot detection processing.

Other Embodiments (1) Although the above embodiment has described a case where the substrate storage condition inspecting apparatus is used for inspection of the storage orientation of the wafer W inside the transport container C for storing disk-shaped wafers W, the shape of the wafer W is not limited to a perfect circular disk shape in plan view. For example, the wafer W may be provided with notches or orientation flats for indicating the orientation of the crystal axis in the wafer.

Although the above embodiment has described a configuration in which the transport container C is used with no front cover attached thereto, the present invention is not limited to this configuration. For example, it is also possible to adopt a configuration in which the front cover is formed of a transparent material, and application of light using the illumination device and image-capturing using the imaging camera are performed from the outside of the front cover.

(2) Although the above embodiment has described a configuration in which the imaging camera 51 is provided at a position that is located above the transport path and that does not overlap the movement range K of the transport container C, the present invention is not limited to this configuration. For example, it is also possible to adopt a configuration in which the imaging camera is provided at a position that is located below the transport path and that does not overlap the movement range K of the transport container C.

Although the above embodiment has described a configuration in which a single imaging camera 51 is used, it is also possible to adopt a configuration in which two or more imaging cameras are provided at positions that do not overlap the movement range K on the transport path. In this case, it is conceivable, for example, to position the imaging cameras on both sides, in the opening width direction, of the movement range K of the transport container C as the positions that do not overlap the movement range K on the transport path.

(3) Although the above embodiment has described an example in which each of the pair of illumination portions 62 includes a light source configured in a vertically elongated form, the form of the light source of each of the pair of illumination portions 62 is not limited to the above-described configuration. It is also possible to use any of light sources having various shapes, including, for example, a point-like light source and a ring-like light source as long as it is capable of applying light to the wafers W supported by all of the support bodies C in the storage space S via the opening Co at the front of the transport container C.

(4) Although the above embodiment has shown, as an example, a configuration in which the substrate storage condition inspecting apparatus is provided on the conveyor 1 that transports the transport container C from the inspection mounting table 1P, serving as the location from which the transport container C is transported, of the conveyor 1 toward the inlet port 19 of the stocker 3, it is also possible to adopt a configuration in which the substrate storage condition inspecting apparatus is provided at the inlet port 19 of the stocker 3 if the conveyor 1 is not provided.

Further, the transport device that transports the transport container C is not limited to a conveyor, and may be another transport device such as a self-propelled vehicle.

(5) In the above-described embodiment, the display on the display unit D shown in FIG. 8 is an example of the display form of the abnormality display processing. In addition to the image display shown in FIG. 8, it is also possible to use various forms of display, including, for example, the form in which high-luminance symbols and abnormality symbols are displayed using only characters in a character mode screen, the forms in which images surrounding the locations where abnormality symbols exist are displayed in an enlarged manner, and the form in which only the overall determination result display E is displayed.

Although the above embodiment has shown, as an example, a configuration in which display on the display unit D provided in the determination control device H is performed as the abnormality display processing, the object on which information is displayed by the abnormality display processing may be a display unit of another computer capable of transmitting/receiving information to/from the determination control device H via a network, or the display screen of a portable wireless terminal carried by the user.

In addition to information display on the display unit D, it is also possible to use information output using lighting of a warning lamp or sound as the abnormality display processing. These may be used alone or in combination of some or all of them.

(6) Although infrared LEDs are used for the illumination device 61, and the imaging camera 51 is configured to be capable of capturing images using infrared light applied by the infrared LEDs of the illumination device 61 in the above embodiment, the present invention is not limited to this configuration.

It is also possible to use a light ray in the visible radiation range as the illumination device 61, and use an imaging camera capable of capturing images using that light ray in the visible radiation range as the imaging camera 51.

The invention claimed is:

1. A substrate storage condition inspecting apparatus whose inspection object is a transport container that is provided with, in a storage space for storing a disk-shaped semiconductor substrate, support bodies for supporting an outer circumferential portion of the semiconductor substrate that are arranged in a plurality of stages in a state in which the support bodies are spaced apart in a vertical direction, and is provided with an opening through which the semiconductor substrate is transported in and out of the storage space from and to the outside, the apparatus comprising:
   an illumination device that applies light through the opening to the semiconductor substrate stored in the transport container located at an inspecting position;
   an imaging device that captures an image of the semiconductor substrate to which light has been applied by the illumination device; and
   a substrate storage condition determining unit that performs substrate storage condition determination processing for determining whether or not a storage orientation of the semiconductor substrate is normal on the basis of the image captured by the imaging device,
   wherein the illumination device includes, on a front side of the opening of the transport container located at the inspecting position, a first illumination portion and a second illumination portion that are spaced apart in a width direction, which is orthogonal to the vertical direction of the opening, and the substrate storage condition determining unit is configured to:

perform luminescent spot detection processing for detecting a pair of high-luminance portions on an inspection image captured by the imaging device, the pair of high-luminance portions being generated by light applied by the first illumination portion and the second illumination portion in locations of a peripheral edge portion of the semiconductor substrate that are circumferentially spaced apart; and perform orientation determination processing for determining whether or not the storage orientation of the semiconductor substrate is abnormal on the basis of a positional correspondence in the vertical direction for the pair of high-luminance portions detected on the inspection image by the luminescent spot detection processing.

2. The substrate storage condition inspecting apparatus according to claim 1,
wherein each of the first illumination portion and the second illumination portion includes a light source configured in a vertically elongated form.

3. The substrate storage condition inspecting apparatus according to claim 1,
wherein the imaging device is constituted by a single imaging camera.

4. The substrate storage condition inspecting apparatus according to claim 1,
wherein a display device that displays a result of determination performed by the substrate storage condition determining unit is provided,
the substrate storage condition determining unit is configured to, if it is determined that another high-luminance portion does not exist in a corresponding portion that is located at a height corresponding to a high-luminance portion detected on the inspection image by the luminescent spot detection processing and that is set at a different position in the width direction from the position of said high-luminance portion, determine the corresponding portion to be an abnormal portion in which the semiconductor substrate does not exist, and perform abnormality display processing, and
the abnormality display processing is processing for displaying, on the display device, a high-luminance symbol indicating the high-luminance portion and an abnormality symbol indicating the abnormal portion in association with a relative positional relationship between the high-luminance portion and the abnormal portion on the inspection image.

5. The substrate storage condition inspecting apparatus according to claim 1,
wherein the inspecting position is set on a transport path along which the transport container is transported,
the first illumination portion and the second illumination portion are provided at positions that are located on both sides, in the width direction, of a movement range of the transport container on the transport path and that do not overlap the movement range, and
the imaging device is provided at a position that is located above the transport path and that does not overlap the movement range.

6. A substrate storage facility comprising:
the substrate storage condition inspecting apparatus according to claim 1; and
a container storage shelf including a plurality of storage portions for storing the transport container,
wherein the substrate storage condition inspecting apparatus is provided at an inlet port of the container storage shelf, or on a transport device that transports the transport container toward the inlet port.

* * * * *